(12) United States Patent
Lin

(10) Patent No.: US 8,076,675 B2
(45) Date of Patent: Dec. 13, 2011

(54) LIGHT-EMITTING DIODE CHIP AND METHOD OF MANUFACTURING THE SAME

(75) Inventor: Da-Wei Lin, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 101 days.

(21) Appl. No.: 12/649,549

(22) Filed: Dec. 30, 2009

(65) Prior Publication Data
US 2011/0127560 A1 Jun. 2, 2011

(51) Int. Cl.
*H01L 27/15* (2006.01)
(52) U.S. Cl. ............... 257/79; 257/E21.121; 438/42
(58) Field of Classification Search .............. 438/42; 257/E21.121, E33.023
See application file for complete search history.

(56) References Cited

U.S. PATENT DOCUMENTS

| | | | |
|---|---|---|---|
| 2002/0017653 A1* | 2/2002 | Chuang | 257/103 |
| 2005/0059238 A1* | 3/2005 | Chen et al. | 438/672 |
| 2007/0069222 A1* | 3/2007 | Ko et al. | 257/86 |

* cited by examiner

*Primary Examiner* — Michael Lebentritt
*Assistant Examiner* — Daniel Whelan
(74) *Attorney, Agent, or Firm* — Altis Law Group, Inc.

(57) ABSTRACT

An LED chip includes a substrate and a p-n junction type semiconductor light-emitting structure. The substrate has a first surface and a second surface opposite to the second surface. The p-n junction type semiconductor light-emitting structure is arranged on the first surface of the substrate. A plurality of blind holes is defined in the second surface of the substrate and extends from the second surface towards the first surface. A heat conductive material is filled in each of the plurality of blind holes thereby forming a plurality of heat conductive poles in the plurality of blind holes.

13 Claims, 2 Drawing Sheets

LIGHT-EMITTING DIODE CHIP AND METHOD OF MANUFACTURING THE SAME

BACKGROUND

1. Technical Field

The present disclosure relates to light emitting diodes (LEDs), and particularly to a light-emitting diode chip which has an improved heat-dissipating characteristic and a method for manufacturing such a light-emitting diode chip.

2. Description of Related Art

Presently, LEDs are preferred for use in non-emissive display devices than CCFLs (cold cathode fluorescent lamp) due to their high brightness, long lifespan, and wide color range.

An LED generally includes an LED chip and a mounting seat defining a recess therein. The LED chip is received in the recess. The mounting seat is then mounted to a circuit board and the LED is electrically connected with the circuit board. Generally, the LED chip is formed on a substrate by a chemical process. The LED chip is mounted in the mounting seat via the substrate. Heat generated by the LED chip is only vertically dissipated to the mounting seat via the substrate of the LED chip. However, the LED chip is required to be more and more powerful while maintaining a smaller size. Therefore, the LED chip generates more heat and the substrate of the LED chip can not efficiently dissipate the heat generated by the LED chip.

Therefore, an LED chip is desired to overcome the above described shortcoming.

DETAILED DESCRIPTION

Figure 1:
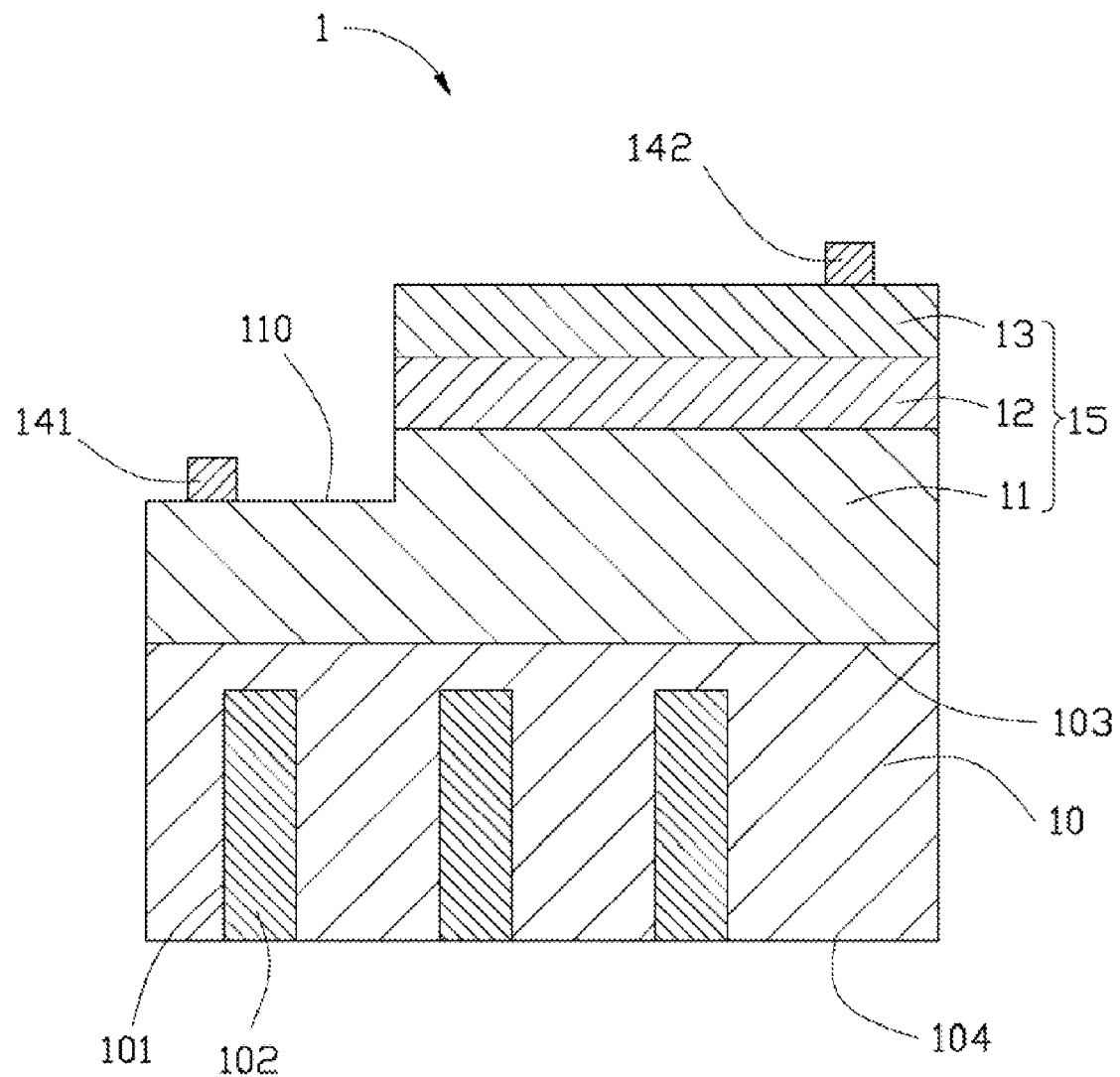
FIG. 1 is a cross-sectional view of an LED chip in accordance with an embodiment of the present disclosure.

FIG. 1 shows an LED chip 1 in accordance with an embodiment of the present disclosure. The LED chip 1 includes a sapphire substrate 10 and a p-n junction type semiconductor light-emitting structure 15. The substrate 10 has a first surface 103 and a second surface 104 opposite to the first surface 103. In the embodiment, the first surface 103 is a top surface of the substrate 10, and the second surface 104 is a bottom surface of the substrate 10. The p-n junction type semiconductor light-emitting structure 15 is arranged on the first surface 103 of the substrate 10.

In the illustrated embodiment, the p-n junction type semiconductor light-emitting structure 15 is gallium nitride-based III-V group compound semiconductor. The p-n junction type semiconductor light-emitting structure 15 includes an n-type semiconductor layer 11, an active layer 12 and a p-type semiconductor layer 13. The n-type semiconductor layer 11, the active layer 12 and the p-type semiconductor layer 13 are sequentially stacked on the first surface 103 of the substrate 10. A first electrode 141 is connected with the n-type semiconductor layer 11 and a second electrode 142 is connected with the p-type semiconductor layer 13.

The n-type semiconductor layer 11 is arranged on the first surface 103 of the substrate 10. The active layer 12 is arranged on the n-type semiconductor layer 11. The p-type semiconductor layer 13 is arranged on the active layer 12. The p-type semiconductor layer 13 and the active layer 12 each are etched away at one side thereof, and a top of the n-type semiconductor layer 11 is also partially etched away at the common side to expose a surface 110 of the n-type semiconductor layer 11. The first electrode 141 is formed on the exposed surface 110 of the n-type semiconductor layer 11. The second electrode 142 is formed on the p-type semiconductor layer 13. A plurality of blind holes 101 are defined in the second surface 104 of the substrate 10 and extend upwardly from the second surface 104 towards the first surface 103. The blind holes 101 in the substrate 10 do not extend through the first surface 103 and are spaced a distance from the first surface 103. A heat conductive material is filled in the plurality of blind holes 101 thereby forming a plurality of heat conductive poles 102. In the illustrated embodiment, the heat conductive material is selected from copper.

During operation, the first and second electrodes 141, 142 of the LED chip 1 are electrically connected to a power source (not shown) to cause the LED chip 1 to emit light. Heat is generated by the LED chip 1 during the operation thereof. The heat of the LED chip 1 can be efficiently transferred downwardly through the substrate 10 via the plurality of heat conductive poles 102 thereby increasing the heat dissipating efficiency of the LED chip 1.

Figure 2:
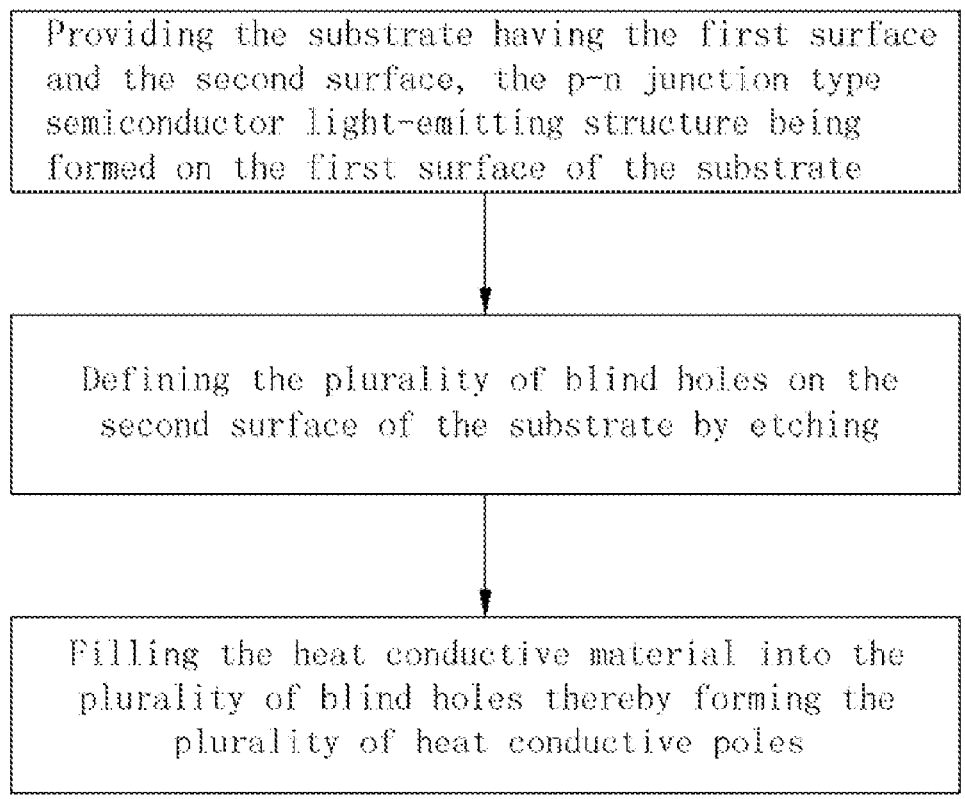
FIG. 2 is a flow chart showing a method for manufacturing the LED chip of FIG. 1.

Referring to FIG. 2, a method for manufacturing the LED chip 1 includes the following steps: providing the substrate 10 having the first surface 103 and the second surface 104, forming the p-n junction type semiconductor light-emitting structure 15 on the first surface 103 of the substrate 10; forming the first and second electrodes 141, 142 on the n-type and p-type semiconductor layers 11, 13, respectively; defining the plurality of blind holes 101 in the second surface 104 of the substrate 10 by etching, wherein the plurality of blind holes 101 extend upwardly from the second surface 104 towards the first surface 103; filling the heat conductive material into the plurality of blind holes 101 by electroplating or electrodeposition thereby forming the plurality of heat conductive poles 102. In the illustrated embodiment, copper is filled in the plurality of blind holes 101 thereby forming the plurality of heat conductive poles 102.

It is to be understood, however, that even though numerous characteristics and advantages of the disclosure have been set forth in the foregoing description, together with details of the structures and functions of the embodiment(s), the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An LED chip, comprising:
   a substrate having a first surface and a second surface opposite to the second surface, a plurality of blind holes being defined in the second surface of the substrate and extending from the second surface towards the first surface, a heat conductive material being filled in each of the plurality of blind holes thereby forming a plurality of heat conductive poles in the plurality of blind holes; and
   a p-n junction type semiconductor light-emitting structure being arranged on the first surface of the substrate,
   wherein the heat conductive poles each are received in a respective blind hole and are separated from each other in a cross sectional view without connecting with each other via the heat conductive material.

2. The LED chip of claim 1, wherein the heat conductive material is copper.

3. The LED chip of claim 1, wherein the substrate is a sapphire substrate.

4. The LED chip of claim 1, wherein the p-n junction type semiconductor light-emitting structure is gallium nitride-based III-V group compound semiconductor.

5. The LED chip of claim 4 further comprising a first electrode and a second electrode, wherein the p-n junction type semiconductor light-emitting structure comprises an n-type semiconductor layer formed on the first surface of the substrate, an active layer formed on the n-type semiconductor layer, a p-type semiconductor layer formed on the active layer, the first electrode connected with the n-type semiconductor layer, and the second electrode connected with the p-type semiconductor layer.

6. The LED chip of claim 5, wherein the p-type semiconductor layer and the active layer each are etched away at one side thereof, and a top of the n-type semiconductor layer is partially etched away at the common side to expose a surface of the n-type semiconductor layer, the first electrode is formed on the exposed surface of the n-type semiconductor layer, and the second electrode is formed on the p-type semiconductor layer.

7. The LED chip of claim 1 further comprising a first electrode and a second electrode connecting with the p-n junction type semiconductor light-emitting structure.

8. A method for manufacturing an LED chip comprising:
providing an electrically-insulating substrate which has a top surface and a bottom surface, in which a plurality of blind holes is defined in the bottom surface and a heat conductive material is filled in the blind holes to form heat conductive poles in the substrate; and providing a p-n junction type semiconductor light-emitting structure on the substrate, in which the p-n junction type semiconductor light-emitting structure comprises an n-type semiconductor layer on the substrate, an active layer on the n-type semiconductor layer and a p-type semiconductor on the active layer and in which a first electrode is formed on the n-type semiconductor layer and a second electrode is formed on the p-type semiconductor layer, wherein the heat conductive poles each are received in a respective blind hole and are separated from each other in a cross sectional view without connecting with each other via the heat conductive material.

9. The method of claim 8, wherein the first electrode is formed on a top of the n-type semiconductor layer, the second electrode is formed on a top of the p-type semiconductor layer, and the top of p-type semiconductor layer is above the n-type semiconductor layer.

10. The method of claim 8, wherein blind holes are defined in the bottom surface of the substrate by etching the substrate.

11. The method of claim 8, wherein the heat conductive material is filled in the blind holes by one of electroplating and electrodeposition.

12. The method of claim 11, wherein the heat conductive material is copper.

13. The method of claim 12, wherein the substrate is made of sapphire.

* * * * *